WAVEFORM GENERATOR CIRCUIT FOR GENERATING TRIANGULAR AND RECTANGULAR WAVEFORM OUTPUTS FROM RAMP WAVEFORM INPUT

Filed June 10, 1966

INVENTORS
ROBERT L. ANDERSEN
HIDEKI D. IZUMI
JONATHAN J. STINEHELFER

BY Brown Jackson Boettcher & Dienner
ATTYS.

United States Patent Office 3,475,622

Patented Oct. 28, 1969

3,475,622

WAVEFORM GENERATOR CIRCUIT FOR GENERATING TRIANGULAR AND RECTANGULAR WAVEFORM OUTPUTS FROM RAMP WAVEFORM INPUT

Robert Leslie Andersen, Fremont, Hideki Danny Izumi, San Jose, and Jonathan Jerold Stinehelfer, Sunnyvale, Calif., assignors to Kaiser Aerospace & Electronics Corporation, Oakland, Calif., a corporation of Nevada Filed June 10, 1966, Ser. No. 556,739
Int. Cl. H03k 3/00, 4/00, 5/01
U.S. Cl. 307—228 2 Claims

ABSTRACT OF THE DISCLOSURE

Triangle waveform generator circuit having a pair of transistors connected in a differential amplifier configuration in which the control element of one transistor is connected to a reference voltage and the control element of the second transistor is connected to the ramp waveform source, each of which is biassed to operate as a switch between on and off conditions in response to said input ramp waveform reaching a predetermined value to thereby provide a first and a second ramp waveform output in the output circuits thereof, the one ramp waveform being of opposite polarity to and symmetrical with the other ramp waveform, and a pair of diodes respectively connected in the output circuits of the two transistors biased to operate at approximately the midpoint of the voltage excursion of the two output ramp waveforms to provide a triangular shaped waveform. A modification of such arrangement using a resistor network connected to the triangle waveform output has pickoff devices connected to different points of the network to provide a plurality of rectangular waveforms which are concurrent and of different widths.

The present invention is directed to a novel waveform generator circuit, and particularly to a generator circuit which uses a differential amplifier circuit as a basic component in the generation of the novel waveforms.

There are presently a number of applications in the field for waveform generator circuits which are both of a relatively simple construction, and additionally are sufficiently flexible to permit variation in the waveshape output with changing input reference signals. Such circuits find particular application in systems which include cathode ray tubes, for example, which provide a visual display, electronically synthesized, of sensor or command information received in analogue form.

It is an object of the present invention to provide a novel waveform generator circuit which includes a differential amplifier circuit for providing a waveform output responsive to a first reference voltage and a ramp input waveform.

It is yet another object of the invention to provide a circuit of such structure which includes means for providing an accurate and reliable time delay with respect to a given time reference.

It is a specific object of the present invention to provide a novel circuit including a differential amplifier and gating means to provide a triangle waveform output, the time of generation of the waveform being adjustable relative to the ramp waveform input by variation of the frequency of the ramp waveform and also by variation of the reference voltage level. A particular feature of the circuit is the manner in which the slope of the output waveform remains constant with variation of the reference voltage.

It is a further object of the present invention to provide a novel circuit which generates a plurality of rectangular waveform outputs in response to a ramp waveform input and a reference voltage input, the square waves generated being concurrent and of different widths.

These and other objects of the invention will be apparent from the following description and accompanying drawings which serve to illustrate various exemplary embodiments thereof, and in which:

FIGURE 1 sets forth the novel circuit for generating a triangle waveform;

GENERAL DESCRIPTION

Figure 1:
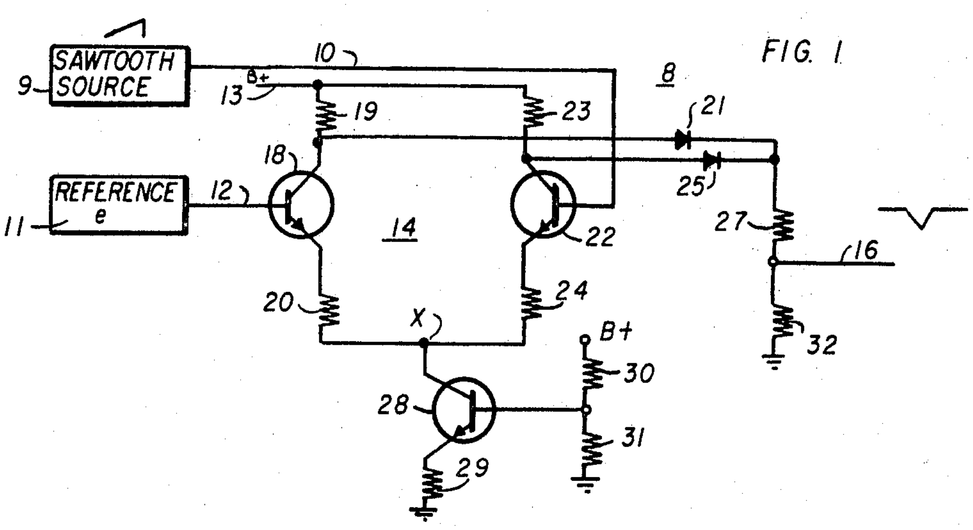

The novel triangle generator circuit 8 of the disclosure is shown in FIGURE 1 and as there shown, the sawtooth generator source 9 is connected to provide a ramp waveform or sawtooth signal over a first input circuit 10, and a second source 11 provides a reference voltage over a second input circuit 12. The input circuits 10, 12 are in turn connected to a differential amplifier 14 which includes a first and second transistor 18, 22, a transistor 28 for providing constant current to the transistors 18, 22, a pair of diodes 21, 25, a divider circuit 27, 32, and an output circuit 16.

As will be shown, with the connection of the sawtooth and reference voltages over the first and second inputs 10, 12 to the triangle generator circuit 8, a triangular waveform will be provided at the output terminal 16, the time of occurrence of the triangular waveform output being adjustable relative to the time of coupling of the ramp waveform to the differential amplifier circuit 14 by adjustment of the reference voltage $e$ to different values. The slope of the sawtooth can also be modified to effect such change in the time domain.

More specifically, the signal output of sources 9 and 11 are fed over input circuits 10 and 12 to the base elements of transistors 22, 18 respectively. The transistors are supplied with constant current by transistor 28 which includes an emitter connected over resistor 29 to ground, a base connected over voltage divider 30, 31 which is in turn connected between B+ and ground, and a collector connected over resistors 20, 24 to the emitters of transistors 18, 22 respectively. The collector of transistor 18 is connected over resistor 19 to a B+ source, and over diode 21 to the divider circuit 27, 32 and the output circuit 16. The collector of transistor 22 is connected over resistor 23 to B+ voltage, and over diode 25 to the divider circuit 27, 32 and the output circuit 16.

Figure 2:
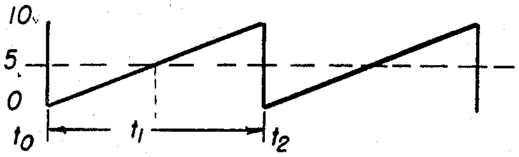
FIGURES 2–4 are illustrative waveshapes setting forth representative input signals, and further an example and explanation of the resultant waveform generated by the novel circuit of FIGURE 1.
Figure 3:
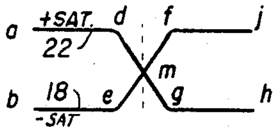
Figure 4:
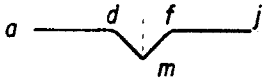

With reference to FIGURE 2, it will be seen that the reference voltage $e$ is selected for use in the system by reference to the range of voltage values of the ramp waveform. Thus, if the sawtooth waveform has an excursion from 0 volts to +10 volts, a reference voltage $e$ is selected which is in such range. As shown in FIGURE 2 by the dotted reference line, with a five volt reference signal the apex of the triangle generated by the circuit will occur at $t_1/2$ where $t_1$ is the duration period of the ramp waveform. As will be apparent from the waveform shown in FIGURE 2, when the value of the ramp waveform input over conductor 10 from source 9 and the value of the reference voltage $e$ input over conductor 12 from source 11 are at the same value, the apex of the generated triangle waveform will be generated as shown in FIGURES 3 and 4. The manner in such the triangle waveshape is generated will now be set forth in more detail.

In the absence of a sawtooth signal on input circuit 10, the five volt signal on the base of transistor 18 will cause the base to be positive relative to the emitter, and transistor 18 will conduct over a circuit extending from B+ over resistor 19, the collector-emitter circuit of transistor 18, resistor 20, the collector-emitter path of transistor 28 and resistor 29 to ground. With transistor 18 conducing, point X in the common emitter circuit of transistor 18, 22 will be positive relative to the voltage on the base of transistor 22, and accordingly transistor 22 will be cut off.

During this period postive saturation voltage appears at the collector of transistor 22 and the negative voltage saturation occurs at the collector of transistor 18 (see *a, d* and *b, e* in FIGURE 3).

As the level of the ramp sawtooth input over conductor 10 from source 9 increases to the point that the base of transistor 22 is slightly more positive than the emitter, current begins to flow over the transistor 22 (point *d*—FIG. 3) from B+ over resistor 23, the collector-emitter circuit of transistor 22, resistor 24, the collector-emitter circuit of constant current supply transistor 28 and resistor 29 to ground. As a result of the current flow, point X becomes more positive, transistor 18 conducts less, and the voltage at the collector of transistor 18 begins to increase (point *e*—FIG 3).

With the continuing increase in the value of the sawtooth voltage level, the transistor 22 conducts more and more, and transistor 18 conducts less and less until such time as positive and negative saturation of transistors 18, 22 are reached respectively (points *f* and *g*—FIG. 3). Since the transistors 18, 22 have now been driven to saturation, further increase in the amplitude of the ramp signal input over conductor 10 will have no further effect thereon.

At such time as the trailing edge of the sawtooth is received, the negative-going voltage signal applied to the base of transistor 22 will cause transistor 22 to be cutoff and, in the manner above described, transistor 18 will be driven to conduction. The voltage level will be correspondingly reversed on the conductors output from the collectors of transistor 18, 22 to the state shown at points *a, b* (FIG. 3).

The duration of the periods *dg, ef* (and thereby the slope of the sides of the triangle waveform output resulting from the changing conductivity of transistors 22, 18 respectively), may be adjusted by varying the values of resistors 20, 24. Thus, the use of a larger value resistor will result in slopes *ef, dg* of a more gentle slope, and the use of a resistor of a smaller value results in a ramp *ef, dg* of a steeper slope. It will be apparent that the frequency of the ramp waveform input over conductor 10 will also affect the slope of the amplified portion of the transfer curve *ef, dg*. That is, a waveform of a shorter frequency will result in a sawtooth input having a steeper slope, and accordingly, the transfer portion *ef* and *dg* will experience a corresponding change in slope.

With variation of the value of the reference signal input over conductor 12, the slope of the output transfer curve will remain constant, but the position of the starting point of the slope of the triangle may be varied in ime between $t_0$–$t_2$ thus achieving an accurate and variable time delay with respect to the time reference $t_0$. Briefly, with reference to FIGURE 2, if the input reference voltage is made more negative, as the ramp waveform provided over conductors 10 to the base of transistor 22 increases, the base of transistor 22 will become positive with respect to the emitter at an earlier point in time, and the transfer of the conditions of the transistors 18, 22 will be initiated at a correspondingly earlier time in the period $t_1$. In a similar manner, if the reference level voltage is made more positive, it will require a longer period of time for the base of transistor 22 to become positive with respect to its emitter, and the transfer will take place at a later time (in the period $t_1$).

The signal output of the collectors of transistor 18, 22, which is coupled over diodes 21, 25 and the voltage divider including resistors 27, 32 to ground results in a triangle waveform output over circuit 16 which is tapped at the connector terminals of resistors 27, 32. Thus, as will now be shown, the operation of the differential amplifier 14 in the manner described provides a triangular wave output which is adjustable in time from $t_0$–$t_2$ as well as in slope.

With reference to transistor 22, it will be recalled that for the initial period of receipt of the sawtooth waveform transistor 22 is cut off, and positive saturation voltage occurs at the collector thereof. Accordingly, diode 25 will conduct, and a positive voltage of constant value will appear at the output circuit 16 as shown in the portion marked *a, d* of FIGURE 4. As the transistor 22 becomes increasingly more conductive (points *d, m*—FIG. 4) the voltage appearing at the collector of transistor 22 becomes increasingly more negative, and at point *m* diode 25 is no longer conductive, whereby the negative-going waveform is no longer transmitted over the output circuit 16.

With reference to transistor 18, it will be apparent that during the time portion *b, e* of the input signal (FIG. 3) transistor 18 is fully conductive, and negative saturation voltage occurs at the collector thereof to cut off diode 21 during such period. As the transistor 18 is rendered increasingly less conductive (the portion *e, f* on the curve—FIG. 3) and point *m* is reached, diode 21 becomes conductive. With increasing cut off of the transistor 18, a more positive potential appears at the collector thereof, and diode 21 conducts to transmit the positive-going signal to the output circuit 16 (*m, f*—FIG. 4). As the transistor 18 is fully cut off (point *f*) the positive saturation voltage appearing at the collector thereof also appears at the output circuit 16 (points *f, j*).

It can be seen from the foregoing arrangement that the relatively simple circuit of FIGURE 1 may be controlled to provide a triangular waveform which is adjustable in time in the time period $t_1$, and additionally, a triangle waveform having sides which may be varied in slope.

SQUARE WAVE GENERATION

Figure 5:
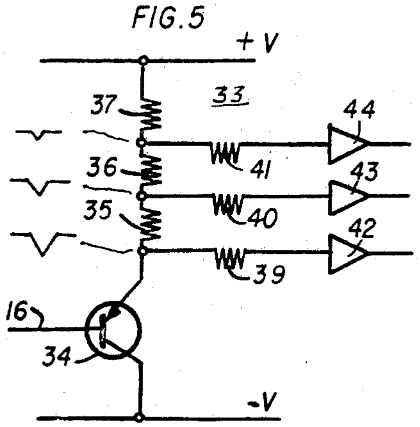
FIGURE 5 illustrates a resistor network and amplifier group used with the circuit of FIGURE 1 to provide concurrent square waves of various sizes.
Figure 6:
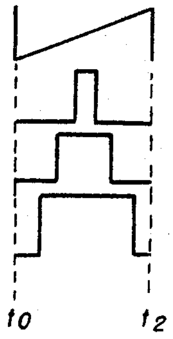
FIGURE 6 illustrates the square waves generated responsive to a ramp signal input to the circuits of FIGURE 1 as used with FIGURE 5.

In addition to the basic uses of the normal circuit as a triangle generator circuit, the inclusion in combination therewith of a simple circuit 33 (FIG. 5) results in the provision of a plurality of square wave signals of different widths responsive to a single triangle waveform input. As shown in FIGURE 5, circuit 33 basically comprises a transistor 34 having a base element connected to the output circuit 16 of the triangle generator, a collector element connected to ground and an emitter element connected over resistor network 35, 36, 37, to positive potential, such network including resistors 39, 40, 41 connected to the junction points in the voltage divider 35–37. The transistor 34 is connected in the manner of a conventional emitter-follower, and the triangle waveform output thereof is coupled over the emitter to the resistor divider network 35–37 which attenuates and level shifts the output triangle waveform. The waveforms of different levels are then amplified at the different levels by amplifiers 42–44 respectively to provide the square waves of different sizes. Thus, the waveform output over resistor 39 as shown by the illustration in FIGURE 5 will comprise a triangle waveshape having a larger amplitude (and wider base) than that which is provided over conductors 40 and 41 respectively. By biassing the amplifiers (which may comprise single transistor stages) so that the value of the triangle waveform generated in each case will drive the associated transistors 42–44 to saturation and cut-off, square waves of correspondingly different time durations will be provided thereby as shown in FIGURE 6.

In a further modification of the invention the base-emitter junction of a transistor can be used as a gating diode in lieu of diodes 21, 25. The low impedance output and reduced loading on the collector circuit in such arrangement will provide an output triangle waveform of improved waveshape. Further, if desired, the voltage which appears across the collector-emitter of transistor 34 can be modulated to produce triangles which lead to gate pulses that are a function of the modulating frequency.

While what is described is regarded to be a preferred embodiment of the invention, it will be apparent that variations, rearrangements, modifications and changes may be made therein without departing from the scope of the present invention as defined by the appended claims.

What is claimed is:

1. In a waveform generator circuit, a first input circuit for providing a reference voltage signal, a second input circuit for providing a ramp waveform signal, a constant current source, a differential amplifier circuit including a first semiconductor having a first element connected to said first input circuit, a second element connected to a first output circuit, a third element connected to said constant current source; a second semiconductor having a first element connected to said second input circuit, a second element connected to a second output circuit, and a third element connected to said constant current source, a first gating diode connected in said first output circuit, a second gating diode connected in said second output circuit, a common output circuit connected to the output of said first and second gating diodes, a resistor network, means connecting said common output circuit to said resistor network, a plurality of pickoff means each of which is connected to a different point of said resistor network, and a plurality of amplifiers, each of which is connected to a different one of said pickoff means and biassed to be driven to saturation by the signal applied thereto by said pickoff means.

2. In a triangle waveform generator circuit for providing a triangular waveform of fixed amplitude, a first source for providing a variable slope input ramp waveform signal; a second source for providing a reference voltage signal within the excursion range of said ramp signal; a differential amplifier circuit including a first and a second semiconductor, means connecting said first source to one of said semiconductors; means connecting said second source to the other of said semiconductors, an output circuit for each semiconductor, first bias means for biasing one of said semiconductors to operate as a switch from an on to an off position in response to said input signal reaching a given voltage value, said one semiconductor providing a second linear ramp waveform signal of one polarity over its output circuit during said switching transitions, said first bias means biasing the other one of said semiconductors to simultaneously switch from an off to an on condition in response to said input signal reaching said predetermined value to provide a third linear ramp waveform signal over its output circuit, during said transition, which is of opposite polarity to, and symmetrical with said second ramp signal; a first gating diode connected in the output circuit of said one semiconductor; a second gating diode connected in the output circuit of said other semiconductor; second bias means for biasing said diodes to operate at the approximate midpoint of the excursion of said second and third ramp waveform signals produced by the switching of said first and second semiconductors, respectively; and a common output circuit connected to the output of said first and second gating diodes to provide triangular waveforms having side slopes determined by the slopes of both of said second and third ramp waveform signals, the time of switching of said semiconductors being varied in accordance with variations in the slope of said input signal to vary the time of occurrence of said triangular waveform output signal, the amplitude of said triangular waveform output signal remaining fixed with variations in the slope of said input signal.

References Cited

UNITED STATES PATENTS

| | | | |
|---|---|---|---|
| 2,620,400 | 12/1952 | Snijders | 328—146 XR |
| 2,933,623 | 4/1960 | Jones et al. | 307—228 |
| 3,054,910 | 9/1962 | Bothwell | 307—235 |
| 3,178,698 | 4/1965 | Graham | 307—235 XR |
| 3,310,688 | 3/1967 | Ditkofsky | 307—235 |

JOHN S. HEYMAN, Primary Examiner

S. D. MILLER, Assistant Examiner

U.S. Cl. X.R.

307—235, 261, 265; 328—146, 183; 330—30